United States Patent [19]
Schach et al.

[11] 4,119,868
[45] Oct. 10, 1978

[54] CIRCUIT ARRANGEMENT

[75] Inventors: Robert Schach, Talheim; Peter Scholl, Weinsberg, both of Germany

[73] Assignee: Licentia Patent-Verwaltungs-G.m.b.H., Frankfurt am Main, Germany

[21] Appl. No.: 780,362

[22] Filed: Mar. 23, 1977

[30] Foreign Application Priority Data

Mar. 25, 1976 [DE] Fed. Rep. of Germany ....... 2612695

[51] Int. Cl.² .......................................... H03K 17/64
[52] U.S. Cl. .................................. 307/253; 307/283; 315/209 T; 361/152
[58] Field of Search ............................... 307/253–255, 307/237, 268, 270, 283, 302; 315/209 M, 209 T; 124/148 E; 361/152, 160

[56] References Cited

U.S. PATENT DOCUMENTS

| | | | |
|---|---|---|---|
| 2,966,615 | 12/1960 | Meyer, Jr. et al. | 307/253 X |
| 3,072,824 | 1/1963 | Short | 315/209 T |
| 3,218,513 | 11/1965 | Short | 315/209 T |

Primary Examiner—John Zazworsky
Attorney, Agent, or Firm—Spencer & Kaye

[57] ABSTRACT

A circuit arrangement for controlling the energization and de-energization of a coil comprises a switching transistor for controlling the coil and which is not provided with protection against avalanche breakdown, a resistor being provided in parallel with the base-emitter path of the switching transistor to prevent overload of the switching transistor during avalanche operation.

5 Claims, 12 Drawing Figures

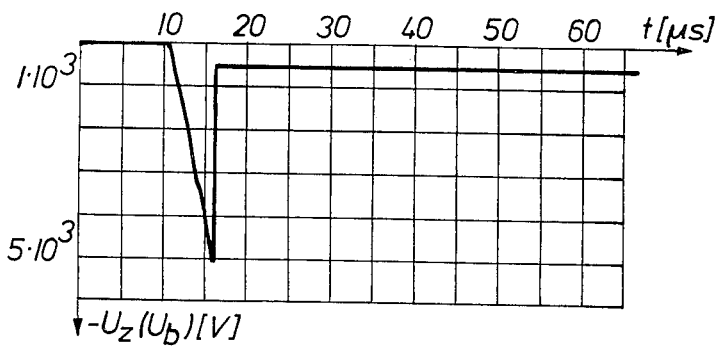
FIG. 7
FIG. 8
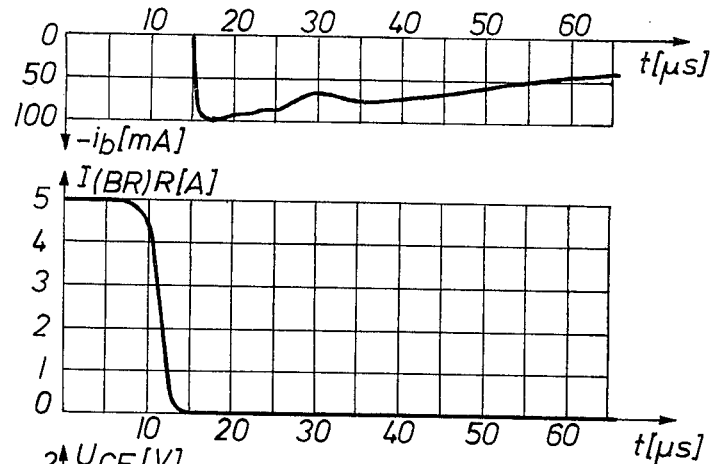
FIG. 9
FIG. 10
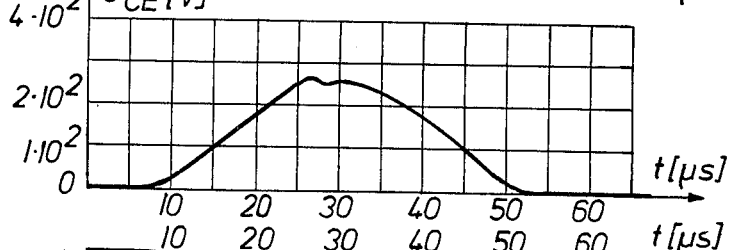
FIG. 11
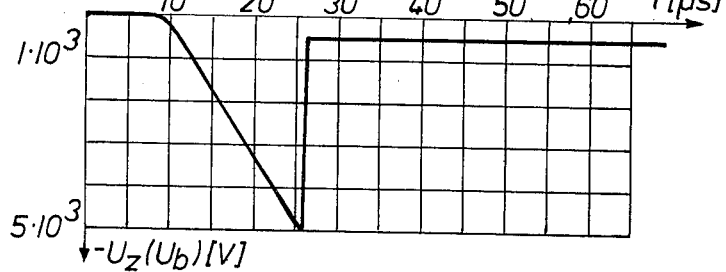
FIG. 12

CIRCUIT ARRANGEMENT

BACKGROUND OF THE INVENTION

The invention relates to a circuit arrangement in which a switching transistor controls the energisation and de-energisation process of a coil. This type of circuit arrangement is used, for example, as a transistor ignition circuit in Otto cycle engines.

With the known transistor ignition circuits high voltage power transistors or Darlington transistors are used as switches in order to control the ignition coil. Triggering of switching transistors takes place for example by means of interrupter contacts, Reed contacts, field plates, inductive generators or by means of optoelectronic arrangements. In order to protect the switching transistor from high back voltage impulses when the interrupter contact is opened, the rise in the primary voltage of the ignition coil is delayed by means of a protective capacitor which is connected in parallel to the emitter-collector path of the switching transistor. Moreover avalanche diodes are connected as protective diodes parallel to the emitter-collector path or, better still, parallel to the base-collector path of the switching transistor, in order to avoid the switching transistor being operated in the avalanche region during interruptions in operation.

SUMMARY OF THE INVENTION

It is an object of the invention to provide a circuit arrangement which requires fewer components than the known transistor ignition circuits and is thus more simply constructed.

According to the invention, there is provided a circuit arrangement in which a switching transistor controls the energisation and de-energisation of a coil, characterized in that no means are used which protect the switching transistor before the avalanche breakdown and that parallel to the base-emitter path of said switching transistor a resistor is effective such that said switching transistor is not overloaded despite avalanche operation.

BRIEF DESCRIPTION OF THE DRAWINGS

The invention will now be described in greater detail, by way of example, with reference to the drawings, in which:

FIG. 7 shows a part of FIG. 4 on an enlarged scale;

FIG. 8 shows a part of FIG. 3 on an enlarged scale;

FIG. 9 corresponds to FIG. 5 showing the collector current of a known protected switching transistor;

FIG. 10 corresponds to FIG. 6 but shows the voltage for the known protected switching transistor;

FIG. 11 corresponds to FIG. 7 but shows the voltage behaviour of the spark gap in the known protected circuit, and FIG. 12 corresponds to FIG. 8 but shows the arc current of the spark plug in the known protected circuit.

DESCRIPTION OF THE PREFERRED EMBODIMENT

Figure 2:
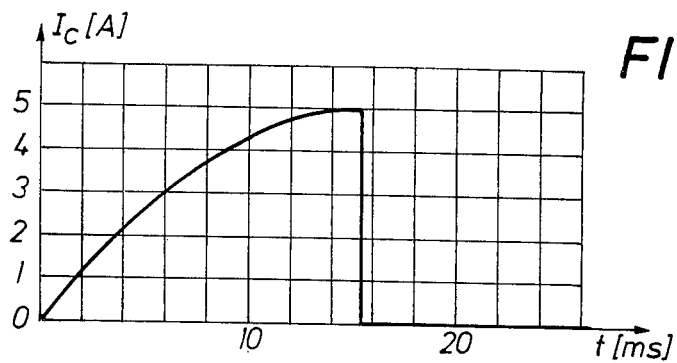
FIG. 2 shows graphically the collector current of the switching transistor of the circuit of FIG. 1 against time.

In a preferred embodiment of the invention, in a circuit arrangement of the type mentioned at the outset, it is proposed that no means should be provided which protect the switching transistor from avalanche breakdown and that parallel to the base-emitter path of the switching transistor, a resistor acts such that the switching transistor is not overloaded despite the avalanche operation.

Therefore while avalanche operation is avoided if possible, in the known transistor ignition circuits, and in particular protective elements are provided to avoid the avalanche operation, then with the present circuit arrangement, the protective capacitor and the protective diodes are dispensed with deliberately and the switching transistor is deliberately run in the avalanche breakdown, which cannot generally be avoided without protective elements. In order not to overload or damage the switching transistor despite avalanche operation, the base-emitter path of the switching transistor is terminated at such a high resistance that the avalanche operation which cannot be avoided during disconnection does not affect the switching transistor.

An open base of the switching transistor would of course represent the highest resistance termination and thus the optimum case with respect to the increase in the avalanche resistance, wherein the base of the switching transistor is neither connected directly to the reference potential nor via a resistor. The concept "open base" is not quite appropriate with this type of operation in fact, as the base of the switching transistor is not in reality connected to the reference potential but to a switch which connects the potential required for switching the switching transistor to the base of the switching transistor.

In practice however the base of the switching transistor is not left open in the above-mentioned sense, as, besides the requirement of a high resistance termination of the base-emitter path of the switching transistor, yet another condition must be fulfilled, i.e. that the emitter-collector leakage current $I_{CEO}$ of the switching transistor is reduced to $I_{CER}$. This condition may only be fulfilled by means of a resistor which, contrary to the condition of the highest possible resistance of termination, lies parallel to the emitter-base path of the switching transistor and is connected to the reference potential.

If the base of the switching transistor is applied via a resistor to the reference potential then of course the high resistance termination of the base-emitter path of the switching transistor is smaller than in the case of the open base. The resistor provided between the base of the switching transistor and the reference potential in accordance with an embodiment of the invention can thus be chosen according to two points of view: on the one hand this resistor must be so highly resistant that the avalanche operation does not damage the switching transistor, on the other hand this resistor must be so low in resistance that it reduces the emitter-collector leakage current of the switching transistor.

In a transistor ignition circuit as already mentioned, a switch is provided in front of the switching transistor for the ignition coil, said switch switching the potential required for switching the switching transistor to the base of the switching transistor. This switch is preferably a switching transistor which is also designated as a driving transistor. If a driving transistor is used as a switch, care should be taken that this transistor does not become too hot during switching of the switching transistor for the ignition coil. This may be prevented by providing a resistor between the collector of the driving transistor and the base of the switching transistor, said resistor being so dimensioned that the driving transistor is operated in saturation during switching of the switching transistor.

In order to satisfy this condition, two resistors in series with respect to each other are provided parallel to the base-emitter path of the switching transistor prior connected to the ignition coil. Of these resistors, the resistor connected to the base of the switching transistor prior connected to the ignition coil is dimensioned such that the driving transistor is operated in saturation during switching of the switching transistor for the ignition coil, while the resistor connected to the reference potential must carry out two conflicting conditions, namely, on the one hand carry out a step down in the switching transistor prior connected to the ignition coil and on the other hand achieve the highest possible highly resistant loading of the emitter-base path of the switching transistor for the ignition coil. Chiefly the resistor connected to the reference potential causes the required high ohmic termination for the emitter-base path of the switching transistor, as the resistor arranged between the collector of the driving transistor and the base of the switching transistor for the ignition coil must be made relatively low in resistance in order to supply the base current of the switching transistor when the driving transistor is saturated. The condition of the highly resistant termination of the base-emitter path of the switching transistor is therefore almost exclusively appropriate solely to the resistor connected to the reference potential.

The resistance value of the resistor connected to the reference potential lies for example in the region of 2 kOhm. The resistor connected to the base of the switching transistor has resistance value, for example which is between 20 ohms and 100 ohms.

The above circuit arrangement not only saves on components but, when it is used as a transistor ignition circuit, it also has the advantage that the primary side back voltage of the ignition coil and thus the ignition voltage at the spark plugs increases steeply. As a result, the ignition voltage is reached very rapidly and moreover the shunt connection losses of the spark plug are very small before the ignition voltage is reached. This has the result that the entire energy is available for a long period of arc current after reaching the conduct arc voltage. A transistor coil ignition constructed in this way and having avalanche operation of the switching transistor has both the advantages of a capacitor ignition (high increase in speed of the ignition voltage) as well as the advantages of a transistor coil ignition (long spark burning period and thus good combustion of the petrol-air mixture).

Figure 1:
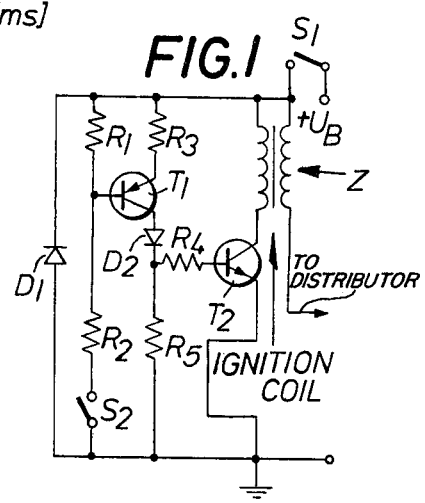
FIG. 1 shows a transistor ignition circuit in accordance with the invention.

Referring now to the drawings FIG. 1 shows a transistor ignition circuit according to the invention. The battery voltage, which is between 6 V and 16.5 V, is only available if the ignition key is operated and thus the switch $S_1$ is closed. If, when the switch $S_1$ is closed, the interrupter contact $S_2$ is also closed then the contact current $I_K$ flows through the resistors $R_1$ and $R_2$. The resistor $R_1$ has an ohmic resistance of 18 ohms in the embodiment and the resistor $R_2$ has an ohmic resistance of 82 ohms. The current $I_K$ flowing through the resistors $R_1$ and $R_2$ has a maximum current intensity of 165 mA.

The resistors $R_1$ and $R_3$ determine the base and the collector current of the low voltage driving transistor $T_1$. The collector current of this driving transistor which supplies the potential required for switching the switching transistor $T_2$ to the base of the transistor $T_2$, chiefly flows across the resistor $R_4$ into the base of the switching transistor $T_2$ and controls the latter. The resistor $R_4$ makes sure that the transistor $T_1$ is saturated and that operation takes place with a low power loss. The collector current of the switching transistor $T_2$ increases exponentially during switching with the time constant $L/R$ of the primary coil of the ignition coil Z and is limited by the internal resistor of the primary coil. During the switching-on time $t_{EIN}$ of the transitor $T_2$, the energy $E \approx \frac{1}{2} LI^2$ is stored magnetically in the ignition coil.

If the interrupter contact $S_2$ is opened then the driving transistor $T_1$ disconnects. As a result the switching transistor $T_2$ also disconnects. The effective base-emitter resistor which lies parallel to the base-emitter path of the switching transistor $T_2$ is produced from the sum of the resistors of $R_4$ and $R_5$. The relatively high resistor $R_5$ which lies between the collector of the transistor $T_1$ and the reference potential makes sure that the switching transistor $T_2$ contains the required avalanche resistance. On the other hand the resistor $R_5$ may not be made with too high a resistance either (for the avalanche resistance of transistor $T_2$ would be of course dispensing with the resistor $R_5$ and thus open base at the most optimum position), as the resistor $R_5$ must make sure moreover that the emitter-collector leakage current of the transistor $T_2$ is not too large. In the embodiment of FIG. 1, a compromise value of 2 kOhms was selected for the resistor $R_5$. The resistor $R_4$ merely has the object of making sure that the transistor $T_1$ operates at saturation during switching of the transistor $T_2$.

In the embodiment of FIG. 1, the resistor $R_4$ has a resistance value of 56 ohms. The effective terminating resistance from the base of the disconnection switching transistor $T_2$ to the reference potential thus amounts in the embodiment to 2.056 kOhms and is therefore chiefly defined by $R_5$.

The back voltage impulse increases very rapidly at the switching transistor $T_2$ and drives it in avalanche operation until the ignition voltage, delayed by shunt connections, is achieved. From this point in time onwards the entire magnetic energy stored in the ignition coil may be discharged by way of a path of spark plugs.

In the embodiment, a transistor of the type BD 176 was used as a driving transistor $T_1$ and a transistor of the type BDY 45 was used as a switching transistor $T_2$. The resistor $R_3$ has a resistance value of 11 ohms in the embodiment. A current of approximately 0.2 A flows through the resistor $R_3$. The ignition coil current amounts to approximately 5 A. The secondary coil of the ignition coil Z is connected to the distributor as well as to the switch $S_1$.

The diodes $D_1$ and $D_2$ prevent the switching transistor $T_2$ from receiving negative base-emitter potential and thus poor avalanche resistance during interruptions in operation. This is true for the npn transistor $T_2$ selected in the embodiment; the reverse is true for a pnp transistor.

FIG. 2 shows the collector current of the switching transistor $T_2$ in a time dependent cycle. As FIG. 2 shows the collector current initially rises exponentially in accordance with the time constant L/R of the primary winding of the ignition coil and then drops abruptly when the switching transistor $T_2$ is disconnected.

Figure 3:
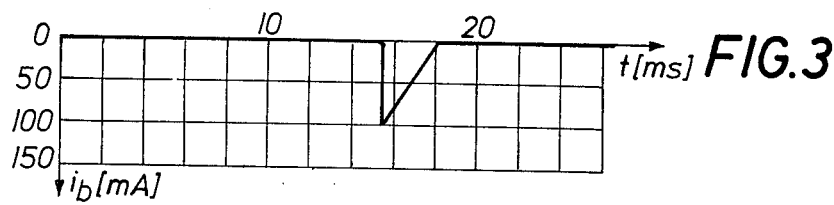
FIG. 3 shows graphically a time curve of the arc current of a spark plug in accordance with the circuit of FIG. 1.

FIG. 3 shows the time curve of the arc current of the spark plug in the same cycle. From this Figure the long spark arc period may be seen as a substantial advantage of the invention.

Figure 4:
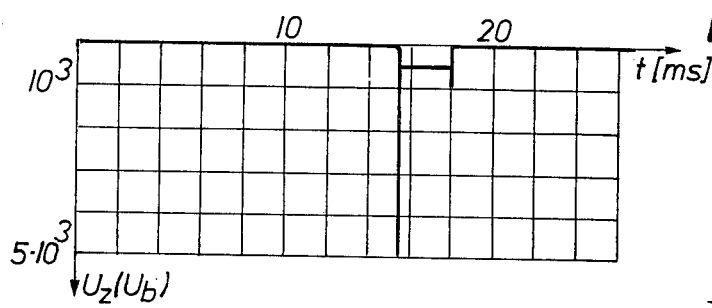
FIG. 4 shows the voltage behaviour of the spark gap.

FIG. 4 shows the voltage behaviour at the spark gap of the spark plugs during the same cycle. The high ignition voltage peak at the spark plug may be seen and the subsequent low arc voltage.

Figure 5:
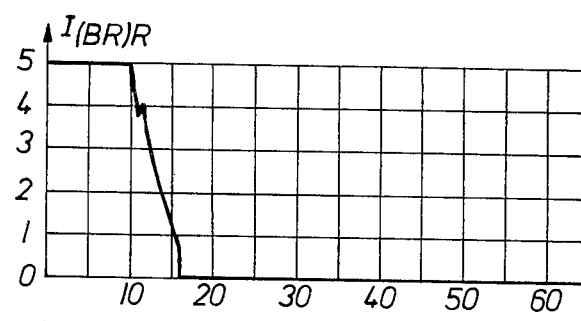
FIG. 5 shows a part of FIG. 2 on an enlarged scale.

FIG. 5 corresponds to FIG. 2 and shows specifically the disconnecting behaviour of the collector current of the switching transistor $T_2$ on an enlarged scale. Disconnection is thus delayed by the fact that, during disconnection, the ignition voltage of the spark plug has not been reached and during the fall-off time of the collector current the ignition coil releases energy to the switching transistor operating in the avalanche breakdown.

Figure 6:
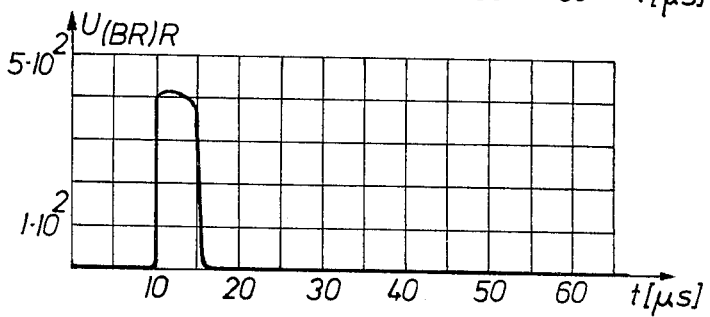
FIG. 6 shows graphically the voltage between the collector and emitter of the switching transistor against time.

FIG. 6 shows the voltage between the collector and the emitter of the switching transistor $T_2$ in dependence on time. As this Figure shows, the voltage during disconnection of the switching transistor increases steeply and is limited to the avalanche voltage of the switching transistor. The voltage falls off abruptly however if the low arc voltage appears at the spark plug.

FIG. 7 corresponds to FIG. 4 but shows only one portion of FIG. 4 on an enlarged scale. As FIG. 7 shows, a delayed voltage increase at the spark plug takes place and abrupt fall off in the ignition voltage also takes place according to the arc voltage of the spark plug.

FIG. 8 corresponds to FIG. 3 but also shows only a portion of FIG. 3 on an enlarged scale. FIG. 8 shows the time curve of the arc current of the spark plug after reaching the arc voltage of the spark plug. When the arc voltage and the increase in the arc current is reached, no further energy is emitted to the switching transistor. Thus the avalanche operation of the switching transistor terminates in agreement with FIGS. 5 and 6.

FIGS. 9 to 12 show the corresponding known relationships in a switching transistor having a protective capacitor and protective diodes without avalanche operation. FIG. 9 corresponds to FIG. 5, FIG. 10 corresponds to FIG. 6, FIG. 11 corresponds to FIG. 7 and FIG. 12 corresponds to FIG. 8. According to FIGS. 9 to 12 the disadvantage of the known circuit lies in the fact that there is a slower increase in the voltage at the spark plug and a delayed use of the arc voltage or arc current to be mentioned.

It will be understood that the above description of the present invention is susceptible to various modifications, changes and adaptions.

What is claimed is:

1. A circuit for controlling the supply of energy pulses to a coil, comprising a switching transistor connected so that its collector-emitter path presents a switchable path for delivery of energization current to the coil and connected to be unprotected against avalanche breakdown operation; resistance means connected in parallel with the base-emitter path of said transistor for preventing said transistor from being overloaded when undergoing avalanche breakdown operation, said resistance means being composed of series connected first and second resistors with the first resistor further connected to said transistor base and the second resistor further connected to said transistor emitter; and a driving transistor for controlling the operation of said switching transistor, said driving transistor having its collector-emitter path connected to the point of connection between said first and second resistors; wherein the resistance value of said first resistor is selected to cause said driving transistor to operate in saturation when it is driving said switching transistor in conduction.

2. A circuit arrangement as defined in claim 1 wherein said second resistor has a high resistance value in order to avoid overloading said switching transistor during avalanche operation.

3. A circuit arrangement as defined in claim 1 wherein said second resistor has a resistance value selected to maintain the emitter-collector leakage current of said switching transistor at a low level.

4. A circuit arrangement as defined in claim 1, wherein a diode is connected between the collector of said driving transistor and the point of connection between said first and second resistors.

5. A circuit arrangement as defined in claim 1 comprising a source of operating voltage connected across said coil and the collector-emitter path of said switching transistor, and a diode connected parallel to said operating voltage source.

* * * * *